United States Patent
Zhang et al.

(10) Patent No.: US 6,774,054 B1
(45) Date of Patent: Aug. 10, 2004

(54) HIGH TEMPERATURE ANNEALING OF SPIN COATED $PR_{1-x}CA_xMNO_3$ THIM FILM FOR RRAM APPLICATION

(75) Inventors: Fengyan Zhang, Vancouver, WA (US); Wei-Wei Zhuang, Vancouver, WA (US); David R. Evans, Beaverton, OR (US); Sheng Teng Hsu, Camas, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 0 days.

(21) Appl. No.: 10/640,728

(22) Filed: Aug. 13, 2003

(51) Int. Cl.[7] .................... H01L 21/31; H01L 21/469
(52) U.S. Cl. .................... 438/781; 438/782
(58) Field of Search .................... 438/781, 782, 438/785, 788, 789, 790, 792, 795

(56) References Cited

U.S. PATENT DOCUMENTS

| | | | | |
|---|---|---|---|---|
| 4,946,710 A | * | 8/1990 | Miller et al. | 427/126.3 |
| 5,188,902 A | * | 2/1993 | Lin | 428/426 |
| 5,342,648 A | * | 8/1994 | MacKenzie et al. | 427/126.3 |
| 5,656,382 A | * | 8/1997 | Nashimoto | 428/620 |
| 5,699,035 A | * | 12/1997 | Ito et al. | 338/21 |
| 6,066,581 A | * | 5/2000 | Chivukula et al. | 501/12 |
| 6,664,117 B2 | * | 12/2003 | Zhuang et al. | 438/3 |

* cited by examiner

*Primary Examiner*—David Nhu
(74) *Attorney, Agent, or Firm*—David C. Ripma; Matthew D. Rabdau

(57) ABSTRACT

A method of forming a PCMO thin film in a RRAM device includes preparing a substrate; depositing a metal barrier layer on the substrate; forming a bottom electrode on the barrier layer; spin-coating a layer of $Pr_{1-x}Ca_xMnO_3$ (PCMO) on the bottom electrode using a PCMO precursor; baking the PCMO thin film in one or more baking steps; annealing the PCMO thin film in a first annealing step after each spin-coating step; repeating the spin-coating step, the baking step and the first annealing step until the PCMO thin film has a desired thickness; annealing the PCMO thin film in a second annealing step, thereby producing a PCMO thin film having a crystalline structure of $Pr_{1-x}Ca_xMnO_3$, where $0.2<=X<=0.5$; depositing a top electrode; patterning the top electrode; and completing the RRAM device.

20 Claims, 2 Drawing Sheets

HIGH TEMPERATURE ANNEALING OF SPIN COATED $Pr_{1-x}Ca_xMnO_3$ THIM FILM FOR RRAM APPLICATION

FIELD OF THE INVENTION

This invention relates to spin coating of PCMO thin films, and specifically to an annealing process to enhance the bipolar switching properties of PCMO thin films in RRAM applications.

BACKGROUND OF THE INVENTION

Electrically programmable resistance non volatile memory device operated at room temperature that use spin on PCMO thin film on Pt substrate was demonstrated by Zhuang, et al., in U.S. patent application Ser. No. 10/256, 380, filed Sep. 26, 2002, for *Method Resistance Memory Metal Oxide Thin Film Deposition*, describes a technique for forming a CMR layer in a RAM device. The PCMO thin film was grown on a Platinum layer, and, following a low heat treatment, exhibited amorphous or polycrystalline structure. This resistor may be reversibly programmed to a high or a low resistance state by unipolar electrical pulses having different pulse widths. However, in order to use the CMR in a RRAM application, bipolar electrical pulses switching properties are more preferred. These switching properties require a well-crystallized PCMO thin film.

SUMMARY OF THE INVENTION

A method of forming a PCMO thin film in a RRAM device includes preparing a substrate; depositing a metal barrier layer on the substrate; forming a bottom electrode on the barrier layer; spin-coating a layer of $Pr_{1-x}Ca_xMnO_3$ (PCMO) on the bottom electrode using a PCMO precursor consisting of $Pr(CH_3CO_2)_3 \cdot H_2O$, $Ca(CH_3CO_2)_2 \cdot H_2O$, and $Mn(III)(CH_3CO_2)_3 \cdot 2H_2O$, in an acetic acid solvent; baking the PCMO thin film in at least one or more separate baking steps, wherein the baking steps may include, e.g., a first baking step at a temperature of between about 50° C. to 150° C. for between about ten seconds to one hour; a second baking step at a temperature of between about 100° C. to 200° C. for between about ten seconds to one hour; and a third baking step at a temperature of between about 150° C. to 300° C. for between about ten seconds to one hour. Alternately, a single baking step at a temperature of between about 50° C. to 300° C. for between about ten seconds to one hour may be used. The baking step(s) are followed by annealing the PCMO thin film in a first annealing step at a temperature of between about 400° C. to 900° C. for between about ten seconds to one hour after each spin-coating step; repeating the spin-coating step, the baking step and the first annealing step until the PCMO thin film has a desired thickness; annealing the PCMO thin film in a second annealing step at a temperature of between about 450° C. to 1000° C., for between about one minute to twenty-four hours, thereby producing a PCMO thin film having a crystalline structure of $Pr_{1-x}Ca_xMnO_3$, where $0.2 \leq X \leq 0.5$; depositing a top electrode; patterning the top electrode; and completing the RRAM device.

It is an object of the invention to specify a high temperature annealing method of a spin-coated PCMO thin film to form a well-crystallized PCMO thin film having bipolar electrical pulse switching properties for use in RRAM applications.

This summary and objectives of the invention are provided to enable quick comprehension of the nature of the invention. A more thorough understanding of the invention may be obtained by reference to the following detailed description of the preferred embodiment of the invention in connection with the drawings.

DETAILED DESCRIPTION OF THE PREFERRED EMBODIMENTS

The method of the invention includes preparation of a substrate, which may be formed of silicon, silicon dioxide, or polysilicon. A barrier layer of Ta, TaN, $Ta_2O_5$, Ti, TiN, TiAlN, TaAlN, TiSiN, TaSiN, TiAl, or TiAlN is deposited on the substrate, and a bottom electrode is formed on the barrier layer. The bottom electrode may be formed of Pt, Ir, or IrTaO. A layer of $Pr_{1-x}Ca_xMnO_3$ (PCMO) thin film is spin coated on the bottom electrode.

The PCMO precursors are $Pr(CH_3CO_2)_3 \cdot H_2O$, $Ca(CH_3CO_2)_2 \cdot H_2O$, $Mn(III)(CH_3CO_2)_3 \cdot 2H_2O$, in an acetic acid solvent. The PCMO thin film is then baked in one or more baking step(s): e.g., a first baking step may include baking at temperature of between about 50° C. to 150° C. for between about ten seconds to one hour, a second baking step may include baking at a temperature of between about 100° C. to 200° C. for between about ten seconds to one hour; and a third baking step may include baking at a temperature of between about 150° C. to 300° C. for between about ten seconds to one hour. More than three baking steps may be used in the method of the invention if desired to achieve the desired film thickness. Alternately, the method of the invention may use a single baking step, which may include baking at a temperature of between about 50° C. to 300° C. for between about ten seconds to one hour. After the baking step(s), the film is rapid thermal annealed (RTA) or furnace pre-annealed in a first annealing step at between about 400° C. to 900° C. for between about ten seconds to one hour after each coating. The spin-coating process is repeated until the PCMO thin film has a desired thickness. The structure is put in RTA or furnace for a post annealing heat treatment, also referred to herein as a second annealing step. The temperature for post annealing heat treatment is between about 450° C. to 1000° C., and the annealing time is between about one minute to twenty-four hours. The annealing atmosphere may be oxygen, nitrogen, argon, or vacuum, or any combination thereof, at a controlled pressure from vacuum to ambient atmosphere. These atmospheres may also be used for any of the baking, pre-annealing and post annealing steps or all steps.

A top electrode of Pt, Ir, Au, or other noble metal or metal oxide, is then deposited on the PCMO thin film and patterned, using either a shallow mask, wet or dry etching process. A post annealing may be performed after the top electrodes deposition and etching. The temperature for the post annealing heat treatment following top electrode deposition is between about 450° C. to 1000° C. and the annealing time is between about one minute to twenty-four hours. Again, the annealing atmosphere may be oxygen, nitrogen, argon or vacuum, or combination thereof, at a controlled pressure from vacuum to ambient atmosphere. The composition of crystalline $Pr_{1-x}Ca_xMnO_3$ is $0.2<=X<=0.5$.

Figure 1:
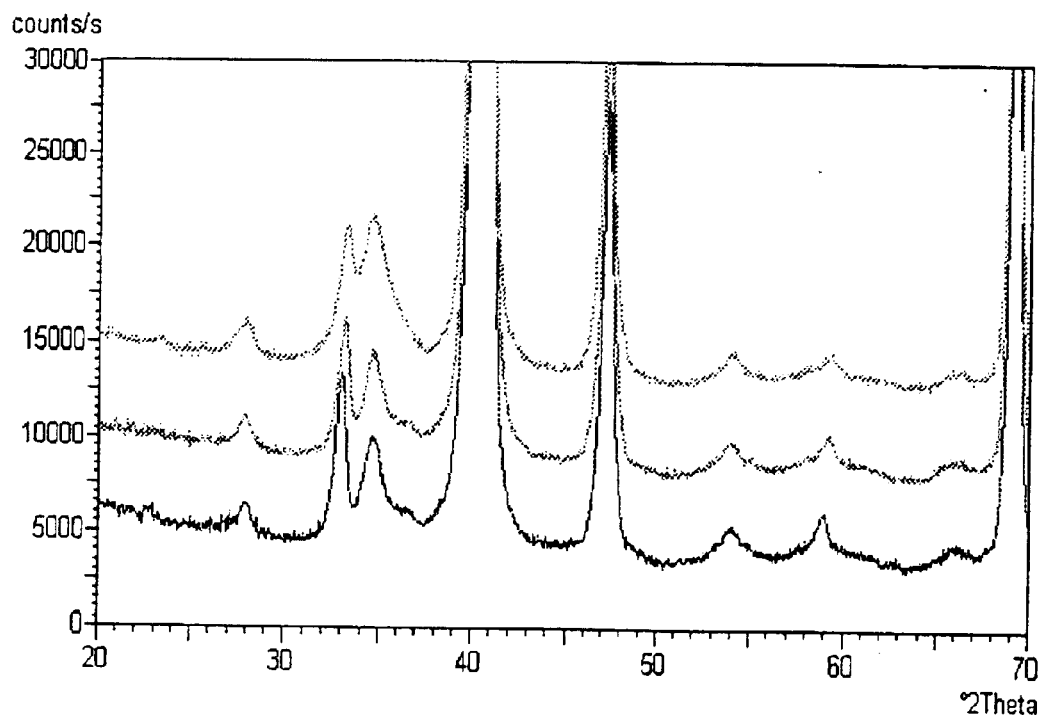
FIG. 1 is a typical XRD spectrum of PCMO thin film grow on an Iridium substrate, annealed at 600° C. for 15 min in Oxygen.
Figure 2:
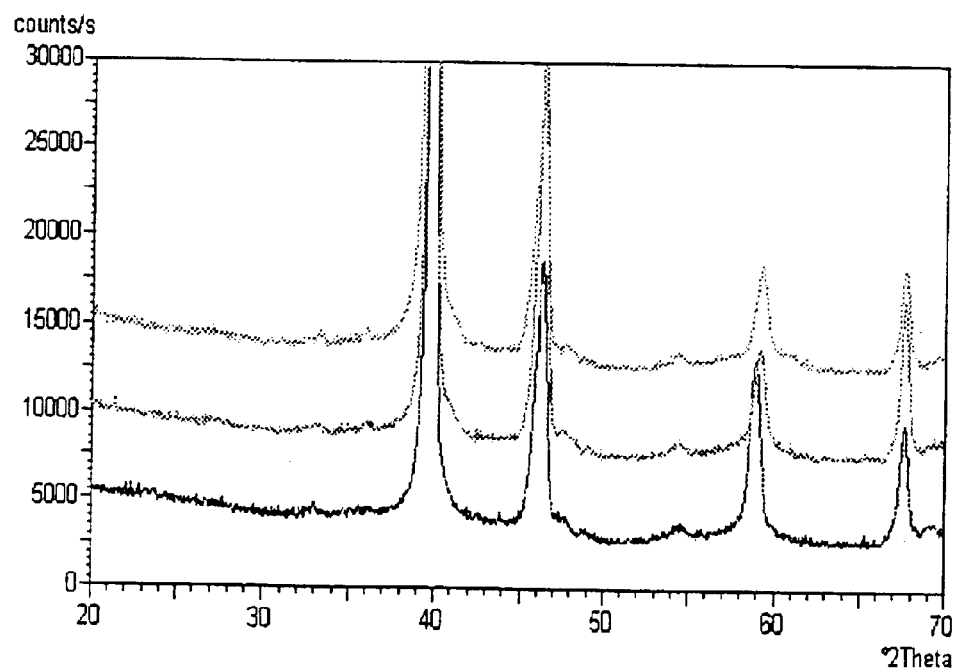
FIG. 2 is a typical XRD spectrum of PCMO thin film grow on a Platinum substrate, annealed at 600° C. for 15 min in Oxygen.
Figure 3:
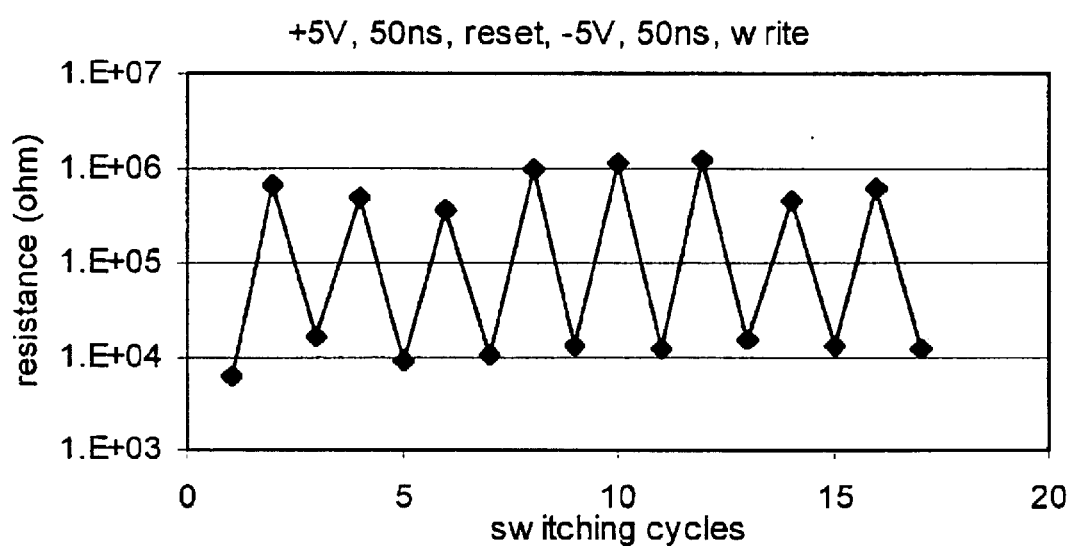
FIG. 3 depicts the resistance switching properties of a $Pr_{1-x}Ca_xMnO_3$, where X=0.4, thin film deposited on a Platinum substrate.

FIG. 1 depicts a typical XRD spectrum of a PCMO thin film grown on an Iridium substrate, and post annealed at 600° C. for 15 min in $O_2$. FIG. 2 depicts a typical XRD spectrum of a PCMO thin film grown on a Platinum substrate, and post annealed at 600° C. for 15 min in $O_2$.

FIG. 2 depicts the resistance switching properties of a $Pr_{1-x}Ca_xMnO_3$ thin film, where X=0.4, deposited on a Platinum substrate. This film was RTA pre-annealed at 500° C. for 5 min for each coating in an oxygen atmosphere and RTA post annealed at 550° C. for 15 min in a nitrogen atmosphere, for three spin-coating cycles, resulting in three layers of PCMO thin film. The write condition for this device is 5V for 50 ns, while the reset condition is -5V for 50 ns. The measurement was done by applying a positive bias to the top electrode and applying a ground probe on the field. The write resistance is about two orders of magnitude greater than that of the reset resistance.

The method of the invention may also be applied to the fabrication of a capacitor of small size, e.g., less than 10 μm.

Thus, a method for high temperature annealing of spin coated $Pr_{1-x}Ca_xMnO_3$ thin film for RRam application has been disclosed. It will be appreciated that further variations and modifications thereof may be made within the scope of the invention as defined in the appended claims.

We claim:

1. A method of forming a PCMO thin film in a RRAM device, comprising:
   preparing a substrate;
   depositing a metal barrier layer on the substrate;
   forming a bottom electrode on the barrier layer;
   spin-coating a layer of $Pr_{1-x}Ca_xMnO_3$ (PCMO) on the bottom electrode using a PCMO precursor consisting of $Pr(CH_3CO_2)_3.H_2O$, $Ca(CH_3CO_2)_2.H_2O$, and $Mn(III)(CH_3CO_2)_3.2H_2O$, in an acetic acid solvent;
   baking the PCMO thin film in at least one baking step, wherein the baking step includes baking at a temperature of between about 50° C. to 300° C. for between about ten seconds to one hour;
   annealing the PCMO thin film in a first annealing step at a temperature of between about 400° C. to 900° C. for between about ten seconds to one hour after each spin-coating step;
   repeating the spin-coating step, the baking step and the first annealing step until the PCMO thin film has a desired thickness;
   annealing the PCMO thin film in a second annealing step at a temperature of between about 450° C. to 1000° C., for between about one minute to twenty-four hours, thereby producing a PCMO thin film having a crystalline structure of $Pr_{1-x}Ca_xMnO_3$, where $0.2<=X<=0.5$;
   depositing a top electrode;
   patterning the top electrode; and
   completing the RRAM device.

2. The method of claim 1 wherein said preparing a substrate includes preparing a substrate taken from the group of substrates consisting of silicon, silicon dioxide, and polysilicon.

3. The method of claim 1 which includes providing an atmosphere for said baking steps, said first anneal step and said second annealing step, wherein the annealing atmosphere is taken from the group of atmospheres consisting of Oxygen, Nitrogen, Argon, vacuum, and any combination thereof, at a controlled pressure ranging from vacuum to ambient atmosphere.

4. The method of claim 1 wherein said depositing a metal barrier layer includes depositing a metal barrier layer taken from the group of metals consisting of Ta, TaN, $Ta_2O_5$, Ti, TiN, TiAlN, TaAlN, TiSiN, TaSiN, TiAl, and TiAlN.

5. The method of claim 1 wherein said depositing a bottom electrode on the barrier metal layer includes depositing a bottom electrode taken from the group of electrode materials consisting of Pt, Ir, and IrTaO.

6. The method of claim 1 wherein said depositing a top electrode includes depositing a top electrode taken from the group of electrode materials consisting of Pt, Ir, Au, other noble metals and noble metal oxides.

7. The method of claim 1 wherein said second annealing step is performed before said depositing a top electrode.

8. The method of claim 1 wherein said second annealing step is performed after said depositing a top electrode.

9. A method of forming a PCMO thin film in a RRAM device, comprising:
   preparing a substrate taken from the group of substrates consisting of silicon, silicon dioxide, and polysilicon;
   depositing a metal barrier layer on the substrate;
   forming a bottom electrode on the barrier layer;
   spin-coating a layer of $Pr_{1-x}Ca_xMnO_3$ (PCMO) on the bottom electrode using a PCMO precursor consisting of $Pr(CH_3CO_2)_3.H_2O$, $Ca(CH_3CO_2)_2.H_2O$, and $Mn(III)(CH_3CO_2)_3.2H_2O$, in an acetic acid solvent;
   baking the PCMO thin film in at least one baking step, wherein the baking step include baking at a temperature of between about 50° C. to 300° C. for between about ten seconds to one hour;
   annealing the PCMO thin film in a first annealing step at a temperature of between about 400° C. to 900° C. for between about ten seconds to one hour after each spin-coating step;
   repeating the spin-coating step, the baking step and the first annealing step until the PCMO thin film has a desired thickness;
   annealing the PCMO thin film in a second annealing step at a temperature of between about 450° C. to 1000° C., for between about one minute to twenty-four hours, thereby producing a PCMO thin film having a crystalline structure of $Pr_{1-x}Ca_xMnO_3$, where $0.2<=X<=0.5$;
   providing an atmosphere for said baking steps, said first annealing step and said second annealing step, wherein the annealing atmosphere is taken from the group of atmospheres consisting of Oxygen, Nitrogen, Argon, vacuum, and any combination thereof, at a controlled pressure ranging from vacuum to ambient atmosphere;
   depositing a top electrode;
   patterning the top electrode; and
   completing the RRAM device.

10. The method of claim 9 wherein said baking the PCMO thin film includes baking the PCMO thin film in at least three separate baking steps, wherein the baking steps include a first baking step at a temperature of between about 50° C. to 150° C. for between about ten seconds to one hour; a second baking step at a temperature of between about 100° C. to 200° C. for between about ten seconds to one hour; and a third baking step at a temperature of between about 150° C. to 300° C. for between about ten seconds to one hour.

11. The method of claim 9 wherein said depositing a metal barrier layer includes depositing a metal barrier layer taken from the group of metals consisting of Ta, TaN, Ta$_2$O$_5$, Ti, TiN, TiAlN, TaAlN, TiSiN, TaSiN, TiAl, and TiAlN.

12. The method of claim 9 wherein said depositing a bottom electrode on the barrier metal layer includes depositing a bottom electrode taken from the group of electrode materials consisting of Pt, Ir, and IrTaO.

13. The method of claim 9 wherein said depositing a top electrode includes depositing a top electrode taken from the group of electrode materials consisting of Pt, Ir, Au, other noble metals and noble metal oxides.

14. The method of claim 9 wherein said second annealing step is performed before said depositing a top electrode.

15. The method of claim 9 wherein said second annealing step is performed after said depositing a top electrode.

16. A method of forming a PCMO thin film in a RRAM device, comprising:

preparing a substrate;

depositing a metal barrier layer on the substrate taken from the group of metals consisting of Ta, TaN, Ta$_2$O$_5$, Ti, TiN, TiAlN, TaAlN, TiSiN, TaSiN, TiAl, and TiAlN;

forming a bottom electrode on the barrier layer taken from the group of electrode materials consisting of Pt, Ir, and IrTaO;

spin-coating a layer of Pr$_{1-x}$Ca$_x$MnO$_3$ (PCMO) on the bottom electrode using a PCMO precursor consisting of Pr(CH$_3$CO$_2$)$_3$.H$_2$O, Ca(CH$_3$CO$_2$)$_2$.H$_2$O, and Mn(III) (CH$_3$CO$_2$)$_3$.2H$_2$O, in an acetic acid solvent;

baking the PCMO thin film in at least three separate baking steps, wherein the baking steps include a first baking step at a temperature of between about 50° C. to 150° C. for between about ten seconds to one hour; a second baking step at a temperature of between about 100° C. to 200° C. for between about ten seconds to one hour; and a third baking step at a temperature of between about 150° C. to 300° C. for between about ten seconds to one hour;

annealing the PCMO thin film in a first annealing step at a temperature of between about 400° C. to 900° C. for between about ten seconds to one hour after each spin-coating step;

repeating the spin-coating step, the baking step and the first annealing step until the PCMO thin film has a desired thickness;

annealing the PCMO thin film in a second annealing step at a temperature of between about 450° C. to 1000° C., for between about one minute to twenty-four hours, thereby producing a PCMO thin film having a crystalline structure of Pr$_{1-x}$Ca$_x$MnO$_3$, where $0.2<=X<=0.5$;

depositing a top electrode taken from the group of electrode materials consisting of Pt, Ir, Au, other noble metals and noble metal oxides;

patterning the top electrode; and completing the RRAM device.

17. The method of claim 16 wherein said preparing a substrate includes preparing a substrate taken from the group of substrates consisting of silicon, silicon dioxide, and polysilicon.

18. The method of claim 16 which includes providing an atmosphere for said baking steps, said first annealing step and said second annealing step, wherein the annealing atmosphere is taken from the group of atmospheres consisting of Oxygen, Nitrogen, Argon, vacuum, and any combination thereof, at a controlled pressure ranging from vacuum to ambient atmosphere.

19. The method of claim 16 wherein said second annealing step is performed before said depositing a top electrode.

20. The method of claim 16 wherein said second annealing step is performed after said depositing a top electrode.

* * * * *

UNITED STATES PATENT AND TRADEMARK OFFICE
CERTIFICATE OF CORRECTION

PATENT NO. : 6,774,054 B1
APPLICATION NO. : 10/640728
DATED : August 10, 2004
INVENTOR(S) : Fengyan Zhan It is certified that error appears in the above-identified patent and that said Letters Patent is hereby corrected as shown below:

ON THE TITLE PAGE AND IN THE SPECIFICATION

Item 54 and in column 1, line 2, in the title, delete "THIM" and insert --THIN--

Signed and Sealed this
Third Day of June, 2014

Michelle K. Lee
*Deputy Director of the United States Patent and Trademark Office*